United States Patent [19]

Singer et al.

[11] 4,173,000
[45] Oct. 30, 1979

[54] SIMULATED VLF/LF NOISE GENERATOR

[75] Inventors: Paul A. Singer; Roger K. Cernius, both of San Diego, Calif.

[73] Assignee: The United States of America as represented by the Secretary of the Navy, Washington, D.C.

[21] Appl. No.: 935,200

[22] Filed: Aug. 21, 1978

[51] Int. Cl.[2] .................... H03B 29/00; H03K 3/84
[52] U.S. Cl. .................................... 331/78; 364/717
[58] Field of Search ......................... 331/78; 364/717

[56] References Cited
U.S. PATENT DOCUMENTS 3,617,925  11/1971  Bensema et al. .................. 331/78

Primary Examiner—Siegfried H. Grimm
Attorney, Agent, or Firm—R. S. Sciascia; G. J. Rubens; T. M. Phillips

[57] ABSTRACT

A reliable, repeatable and stable generator capable of producing noise with known or given amplitude probability distributions up to 96 dB dynamic range, commonly found in atmospheric noise VLF/LF frequency bands. A continuous impulse noise amplitude probability distribution is digitally synthesized in a piece-wise fashion in 6 dB amplitude increments. These increments are linearly combined with a digitally generated Gaussian noise component for simulation of VLF and LF atmospheric noise.

8 Claims, 6 Drawing Figures

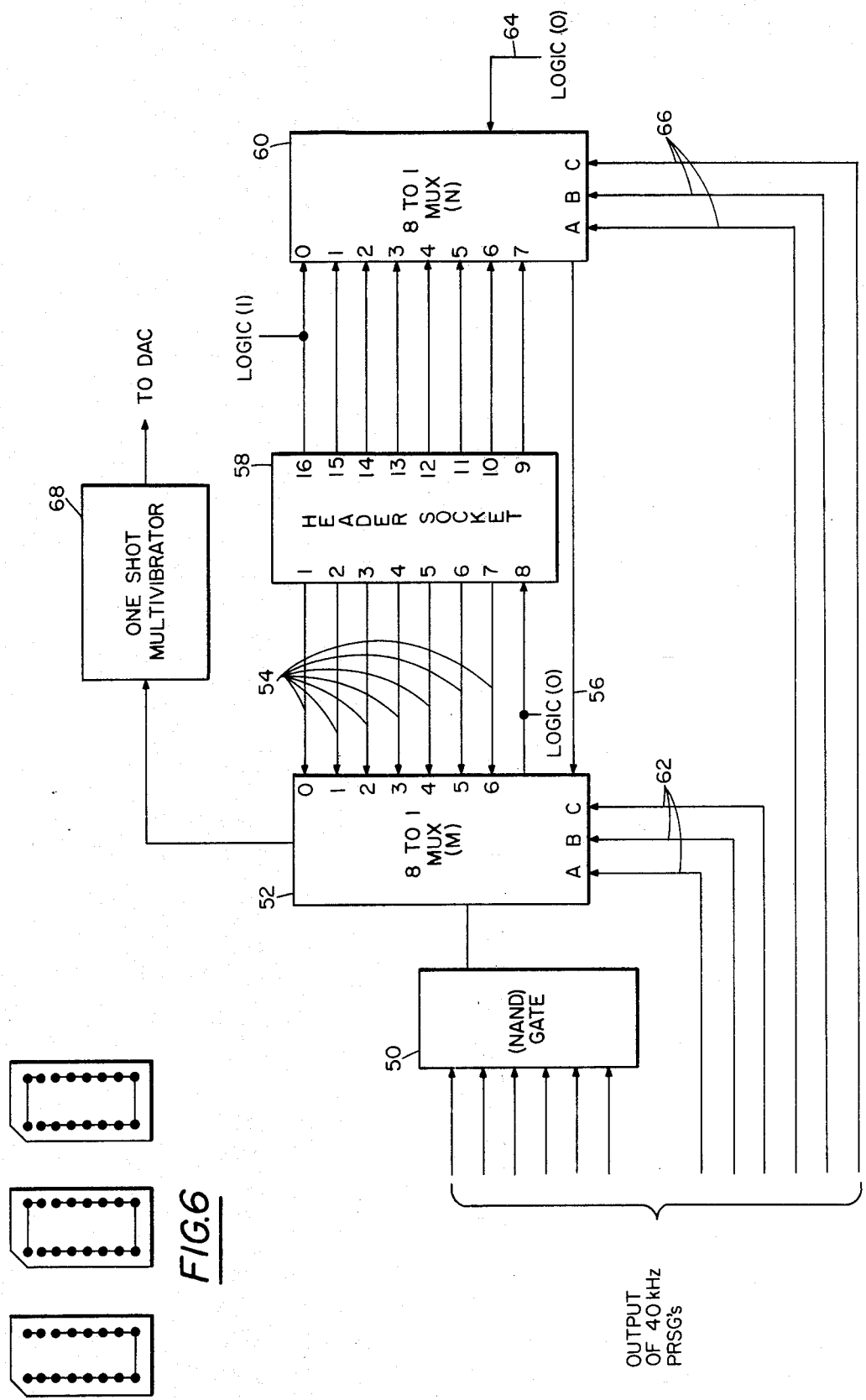

SIMULATED VLF/LF NOISE GENERATOR

BACKGROUND OF THE INVENTION

Atmospheric noise at VLF/LF is highly impulsive and nonstationary over any time interval greater than 10 to 15 minutes. Because of the excellent propagation of energy in this frequency range, the noise, which is produced by lightning discharges, is characterized by high dynamic range impulses on the order of 60 dB or more over that of noise components which are Gaussian distributed. The noise in general can be described as a low amplitude Gaussian type background noise in combination with that of the impulsive noise. Because of the nonstationary characteristic of VLF/LF atmospheric noise, attempts have been made in the past to simulate its characteristics in such a manner that communication systems could be elevated with repeatability.

In the past, attempts to produce given amplitude probability distributions used a single pseudo random sequence generator (PRSG) feeding several NAND gates to produce pulses of fixed probability. These pulses of fixed probability were linearly summed in a "Summing Bus" consisting of resistors of different value and an operational amplifier. Each pulse of fixed probability had assigned a specific resistor. Gaussian noise was added to the noise at the "Summing Bus" in cases where dynamic range was not required. The Gaussian noise was used to amplitude modulate the pulses for added randomness. This technique suffered from the disadvantages that the single PRSG did not allow the production of a pulse with significant temporal statistical independence. The probability of the pulses produced were fixed. The amplitudes of the pulse could be changed only by replacing one of the resistors in the "Summing Bus". Due to the lack of statistical independence of pulses (i.e., two pulses had a joint probability) there was great difficulty in attempting to fit amplitude probability distributions commonly seen in VLF/LF spectrum. Also the use of a "Summing Bus" and amplifier produces an unwanted coherent noise which limits the dynamic range. The action of the single PRSG and NAND gates produce a transient noise on the "one shot" pulse lines. Since this noise on each of the lines is the same, it was coherently added in the "Summing Bus".

SUMMARY OF THE INVENTION

The present invention provides for an alterable generator that has a continuous impulse noise amplitude probability distribution digitally synthesized in a piecewise fashion in discrete amplitude increments. These increments are linearly combined with a digitally generated Gaussian noise component for simulation of the VLF/LF atmospheric noise. The discrete increments are generated by means of a clock driving a plurality of PRSG's of the linear feedback type. These increments are fed to programmable probability gates and combined in a manner to provide for the simulation of the VLF/LF atmospheric noise.

Accordingly, an object of the invention is the provision of a reliable, repeatable, and stable noise generator capable of producing noise with known or given amplitude probability distribution of the power range commonly found in atmospheric noise at VLF and LF frequency bands.

Another object of the invention is the combining of continuous impulse noise amplitude probability distribution generated by programmable probability gates with Gaussian noise to provide for simulation of VLF and LF atmospheric noise.

Other objects and many of the attendant advantages of this invention will be readily appreciated as the same becomes better understood by reference to the following detailed description when considered in connection with the accompanying drawings.

FIG. 3 is a block diagram of the programmable probability gate and one shot multivibrator of FIG. 1.

FIG. 6 shows a probability gate header wired for use in the header socket of FIG. 3.

DESCRIPTION OF THE PREFERRED EMBODIMENTS

Figure 1:
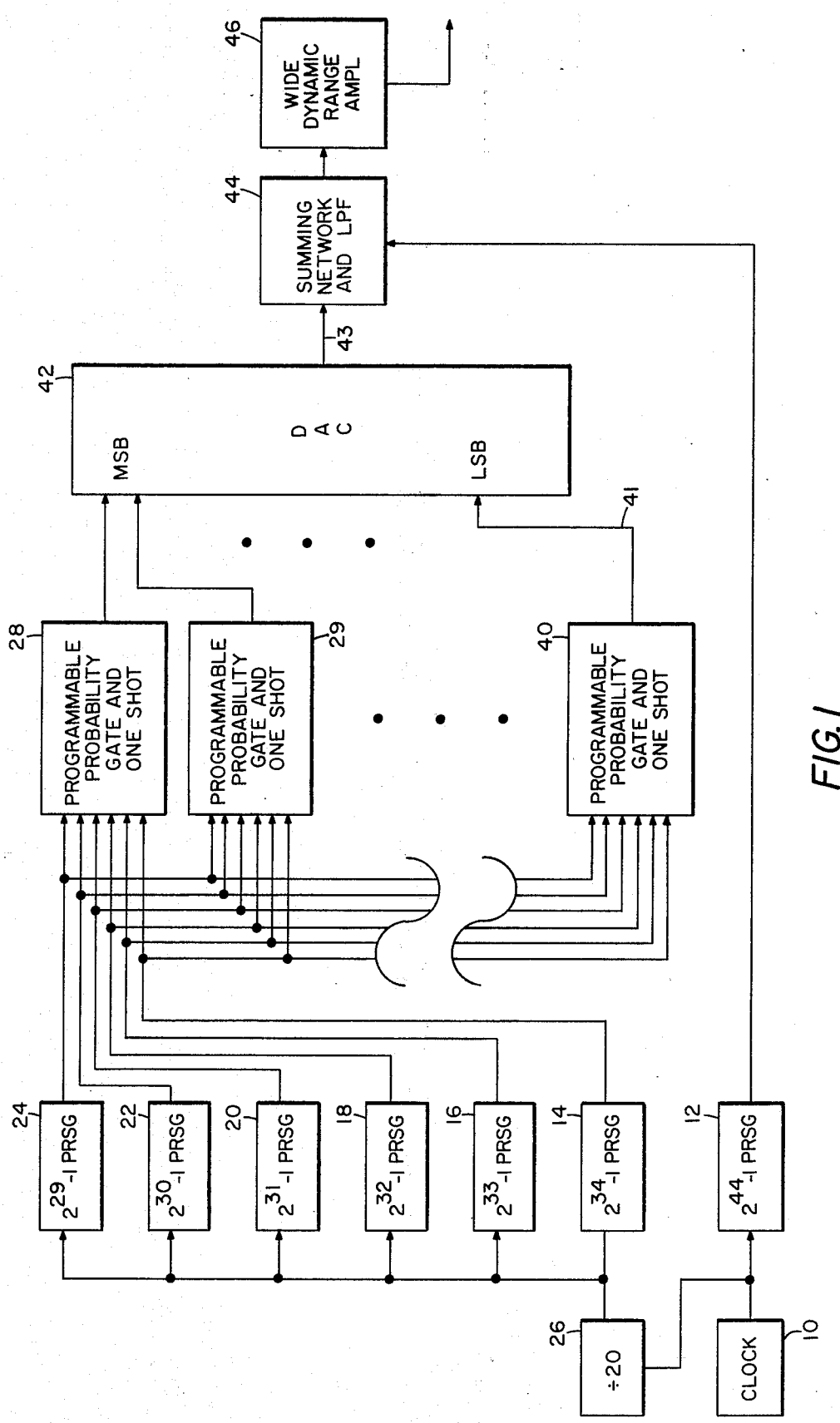
FIG. 1 shows in block diagram the preferred embodiment of the invention.
Figure 2:
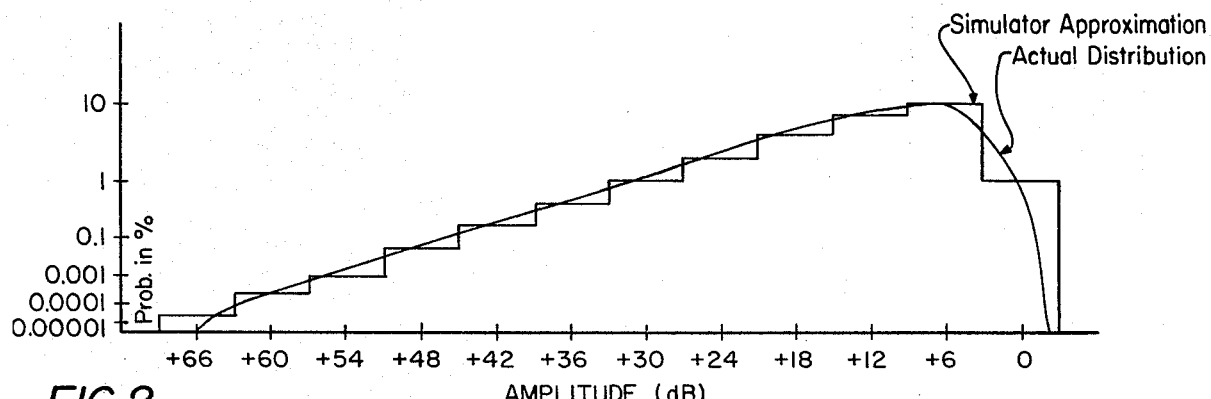
FIG. 2 is a graph showing the simulated signal.

Referring now to the drawings wherein there is shown in FIGS. 1 and 2 a preferred embodiment of the invention. Referring now to FIG. 1, a clock 10 operating at a frequency of 800 kHz drives seven PRSG's 12, 14, 16, 18, 20, 22 and 24 of the linear feedback type. PRSG 12 is driven directly by clock 10 while PRSG's 14, 16, 18, 20, 22 and 24 are driven by the clock signal after being divided down in the divide by 20 circuit 26. Changes to the division ratio in circuit 26 can be used to change the basic "slope" of the simulation (FIG. 2). Therefore each of PRSG 14, 16, 18, 20, 22 and 24 are driven by a 40 kHz frequency. The PRSG's utilized contain shift registers of 29 bits for PRSG 24, 30 bits for PRSG 22, 31 bits for PRSG 20, 32 bits for PRSG 18, 33 bits for PRSG 16, 34 bits for PRSG 14 and 44 bits for PRSG 12. They produce sequences of the following lengths: $2^{29}-1$ bits in PRSG 24, $2^{30}-1$ bits in PRSG 22, $2^{31}-1$ bits in PRSG 20, $2^{32}-1$ bits in PRSG 18, $2^{33}-1$ bits in PRSG 16, $2^{34}-1$ bits in PRSG 14 and $2^{44}-1$ bits in PRSG 12. These lengths were selected because they have few common factors. The outputs of the 40 kHz driven PRSG's are connected to 12 programmable probability gates 28 through 40. In general, only one line from each 40 kHz driven PRSG shift register bit stage is used for input to each of the programmable probability gates 28 through 40. No more than 6 lines from any PRSG goes to any programmable probability gate.

The outputs from the program probability gate and one shot multivibrator 28 through 40 are fed to a digital to analog converter 42 which provides an analog output to "Summing Bus" and low pass filter 44 to provide the desired simulated atmospheric noise which is fed to amplifier 46.

The programmable probability gates 28 through 40 is shown in FIG. 3. The outputs of the PRSG's are in the form of binary logic voltages which are denoted as 1 or 0. The outputs from the 40 kHz driven PRSG's lines to that particular programmable probability generator shown in FIG. 2 are used in two ways: first the lines are input to a NAND gate 50 and second as control inputs (A, B, and C) to multiplexers 52, and 60. The inputs to NAND gate 50 are nanded together having the resultant output which is the enabling pulse to multiplexer 52. All the inputs to NAND gate 50 have to be at a logic 1 for the output to be a logic 0; otherwise the output from NAND gate 50 is a logic 1. If the enable input to multiplexer 52 is a 1, the output of the multiplexer 52 is a logic 0. If the input to a multiplexer 52 is a 0, the output of the multiplexer 52 is determined by the data inputs 54 and 56 from header socket 58 and multiplexer 60, respectively. The data select input 62 comes from individual taps from the stages of the 40 kHz PRSG's 14, 16, 18, 20, 22 and 24 (FIG. 2). The output of multiplexer 52 when the enable pulse from NAND gate 50 is 0 is determined by the table below.

| A | B | C | Data Selected |
|---|---|---|---------------|
| 0 | 0 | 0 | 0 |
| 0 | 0 | 1 | 1 |
| 0 | 1 | 0 | 2 |
| 0 | 1 | 1 | 3 |
| 1 | 0 | 0 | 4 |
| 1 | 0 | 1 | 5 |
| 1 | 1 | 0 | 6 |
| 1 | 1 | 1 | 7 |

Multiplexer 60 is similar to multiplexer 52 but with all data inputs coming from header socket 58. The enable input 64 is set to a fixed logic 0, the data select lines 66 are from the 40 kHz PRSG's 14, 16, 18, 20, 22 and 24 and the output 56 is fed as one of the data input lines to multiplexer 52.

The number of logic 1's or logic 0's at the input to either multiplexer 52 or 60 can be altered by wiring a header (FIG. 6) which will fit into the header socket 58 such that the desired number of logic 1's are connected to pin 16 and the desired number of logic 0's are connected to pin 8.

If the number of inputs to NAND gate 50 is denoted by K, the number of logic 1 inputs to multiplexer 52 is denoted by M, and the number of logic 1 inputs to multiplexer 60 is denoted by n, the probability of the logic 1 output from multiplexer 52 is given by $$P(1) = (8m + n)/2^{(6+K)}$$

where
$0 \leq K$
$0 \leq m \leq 7$
$1 \leq n \leq 8$

The output of each of the 12 programmable probability gates 28 through 40 is fed to a separate one shot multivibrator 68. The output from each one shot multivibrator 68 is fed to digital to analog converter 42 (FIG. 1). Referring to FIG. 1 and assuming the least significant input 41 when pulsed by one shot multivibrator 68 produces an output level at 43 of A, then the output 43 is a random series of pulses ranging in amplitude from A to A $(2^N-1)$ where N = the number of address lines used in digital to analog converter 42.

Figure 4:
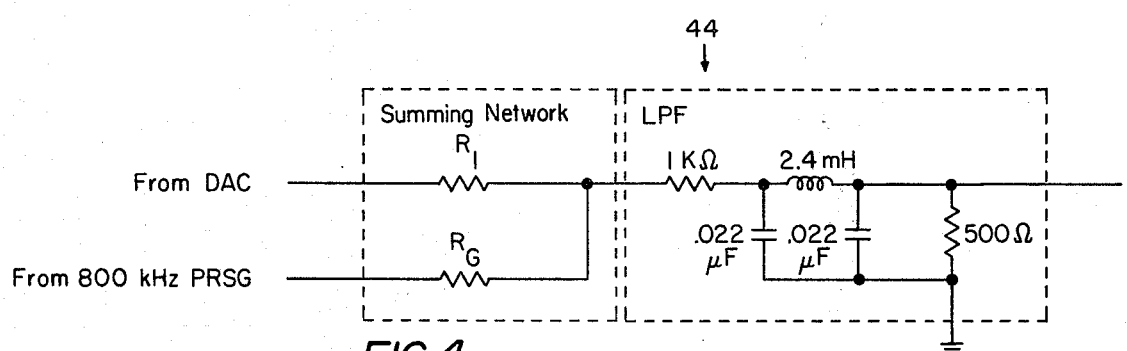
FIG. 4 is a schematic of the "Summing Network" and low pass filter of FIG. 1.

The output 43 from digital to analog converter 42 and the output of the 800 kHz PRSG 12, which is Gaussian in nature, are inputs to the summing network and low pass filter 44 as shown in FIG. 4. The summing network consists of two resistors $R_1$ and $R_G$. The values of these two resistors determine the proportion of Gaussian noise that is linearly summed with the impulsive noise. The greater the ratio $R_1$ to $R_G$, the more Gaussian noise relative to impulsive noise.

The output of the summing network is then passed through a low pass filter to limit the bandwidth of the output. With the energy being confined to a limited bandwidth, it can be amplified by a wide dynamic range amplifier 46 (FIG. 1) to produce the desired output at a convenient amplitude level.

Figure 5:
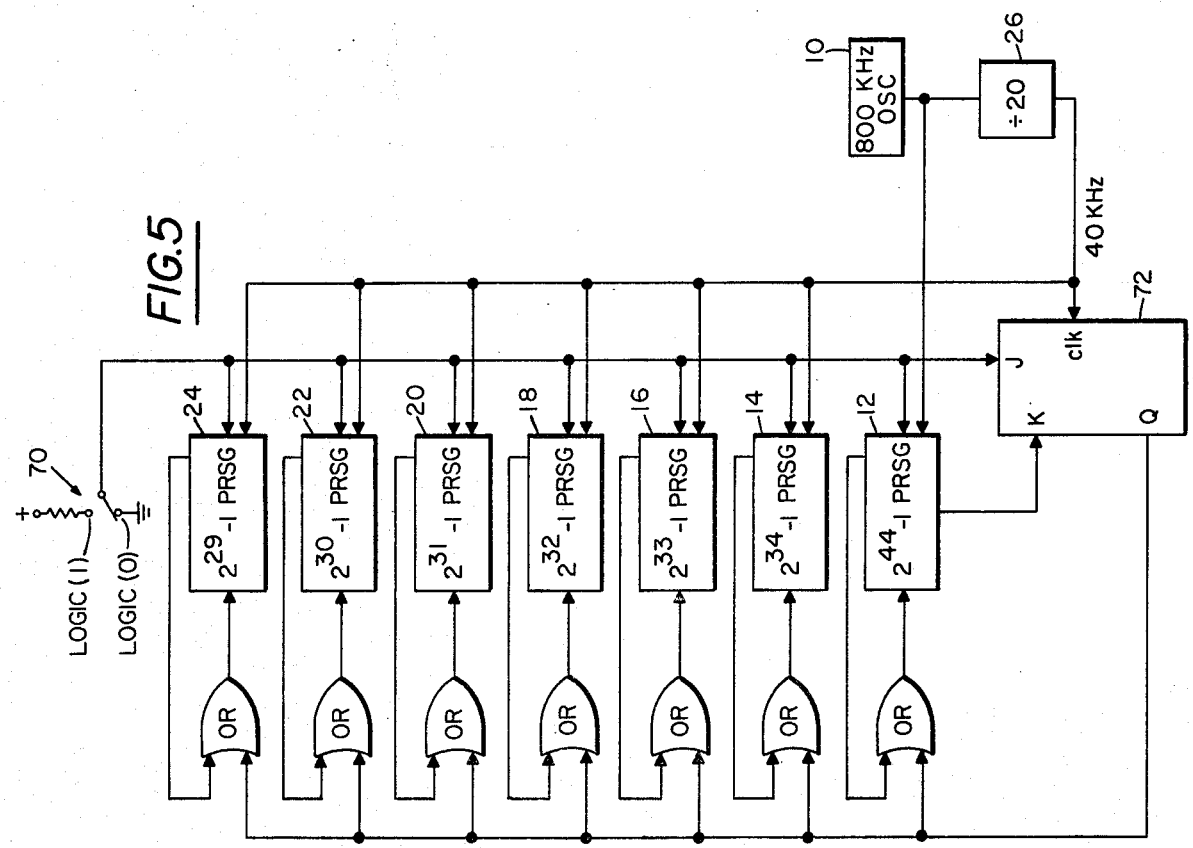
FIG. 5 is a block diagram of the initialization circuit of the PRSG's of FIG. 1.

The temporal characteristics of the output noise waveform is made repeatable by initialization of the PRSG. The initialization of the PRSG is shown in FIG. 5. The clear switch 70 is positioned to the logic 1 position to cause all stages of the PRSG's to go to a logic 0. This also causes the J-K flip-flop 72 to have a logic 1 on the Q output line. Each PRSG 12 through 24 has associated with it an "OR" gate. These "OR" gates "or" the output of PRSG's of the exclusive "OR" gate in a linear feedback shift register sequence with the Q output of J-K flip-flop 72 and uses the result as an input to the first stage of the shift register in the PRSG's. When the clear switch 70 is returned to the logic 0 position, the PRSG's 12 through 24 start to shift their respective data inputs from the "OR" gates and load logic 1's until the 25th stage of the 800 kHz PRSG 12 outputs a logic 1 which causes the J-K flip-flop 72 to change state and output a logic 0 at output Q.

Obviously, many other modifications and variations of the present invention are possible in the light of the above teachings. It is therefore to be understood that within the scope of the appended claims the invention may be practiced otherwise than as specifically described.

What is claimed is:

1. A simulated VLF/LF noise generator comprising:
   a Gaussian noise signal source;
   an impulse noise source having amplitude probability distribution, digitally synthesized in a piece-wise fashion in discrete amplitude incrementers said impulse noise source comprising:
   a plurality of pseudo random signal generators for generating a plurality of digital signals;
   a programmable probability gate coupled to said pseudo random signal generators and being responsive to said plurality of digital signals for converting said digital signals into a plurality of random digital pulses with a programmable probability;
   a digital to analog converter coupled to said programmable gate for converting said digital pulses to output analog pulses of random amplitude and distribution;
   summing network means connected to said Gaussian noise source and to said digital to analog converter for summing said analog pulses and said Gaussian noise in a predetermined ratio to provide the desired simulated noise signal.

2. The noise generator set forth in claim 1 wherein said programmable probability gate includes a NAND gate having a plurality of inputs coupled to the outputs of said plurality of pseudo random signal generators and having an output;
   multiplexer means having an input coupled to the output of said NAND gate, an output, data control input means and data input means;
   whereby the output of said multiplexer means is a logic 0 when the input from said NAND gate is a logic 1 and when the input from said NAND gate is a logic 0, the output of said multiplexer means is determined by the data input as controlled by said data control input means.

3. The noise generator of claim 2 wherein said output analog pulses of random amplitude and distribution are adjusted by varying the clocking of said pseudo random signal generators.

4. The noise generator of claim 2 wherein said data input to said multiplexer means are generated by a header wired in a predetermined configuration.

5. The noise generator of claim 4 wherein said output analog pulses of random amplitude and distribution are adjusted by changing the wiring configuration of said header.

6. The noise generator of claim 2 wherein said output analog pulses of random amplitude and distribution are adjusted by changing the ratio of the summed input signals in said summing network.

7. The noise generator of claim 1 further comprising initialization means coupled to said impulse noise source causing the temporal characteristics of said simulated noise signal to be repeatable.

8. The noise generator of claim 2 wherein said multiplexer means includes more than one multiplexer to provide for an increase in the number of increments within the probability range.

* * * * *